United States Patent
Reffay et al.

[19]

[11] Patent Number: 5,936,471
[45] Date of Patent: Aug. 10, 1999

[54] FREQUENCY COMPENSATION OF A CURRENT AMPLIFIER IN MOS TECHNOLOGY

[75] Inventors: Marius Reffay, Grenoble; Michel Barou, Voreppe, both of France

[73] Assignee: STMicroelectronics, S.r.l., Agrate Brianza, Italy

[21] Appl. No.: 08/893,247

[22] Filed: Jul. 15, 1997

[30] Foreign Application Priority Data

Jul. 16, 1996 [FR] France ................................. 96/09130

[51] Int. Cl.⁶ ............................................. H03F 3/16
[52] U.S. Cl. ................................... 330/300; 330/288
[58] Field of Search ........................ 330/288, 300, 330/292

[56] References Cited

U.S. PATENT DOCUMENTS

| | | | |
|---|---|---|---|
| 4,008,441 | 2/1977 | Schade Jr. | 330/288 |
| 4,034,307 | 7/1977 | Schade, Jr. | 330/35 |
| 4,345,213 | 8/1982 | Schade, Jr. | 330/253 |
| 4,686,487 | 8/1987 | Radovsky | 330/288 |
| 5,079,518 | 1/1992 | Wakayama | 330/300 |
| 5,283,537 | 2/1994 | Nakamura | 330/288 |

FOREIGN PATENT DOCUMENTS 0180875  5/1986  European Pat. Off. .

*Primary Examiner*—Robert Pascal
*Assistant Examiner*—Khanh Van Nguyen
*Attorney, Agent, or Firm*—David V. Carlson; Kevin S. Ross; Seed and Berry LLP

[57] ABSTRACT

The present invention relates to a current amplifier including a first MOS transistor with a drain defining a first terminal for controlling the amplifier with a current and a source connected to a first supply line. It also includes a second MOS transistor with a drain forming a terminal of current output of the amplifier and a source connected to the first supply line, and at least one first bipolar transistor having a base connected to the first control terminal, an emitter connected to a gate of the first MOS transistor and is, via a first biasing resistor, connected to the first supply line and having a collector of the first bipolar transistor being connected to a second supply line.

16 Claims, 2 Drawing Sheets

5,936,471

FREQUENCY COMPENSATION OF A CURRENT AMPLIFIER IN MOS TECHNOLOGY

BACKGROUND OF THE INVENTION

1. Field of the Invention

The present invention relates to the field of current amplifiers having an output stage comprised of MOS transistors. The present invention more specifically applies to a frequency compensation of an output stage comprised of a MOS power transistor.

2. Discussion of the Related Art

FIG. 1 shows a conventional example of a current output amplifier having an output transistor in MOS technology.

An output stage of the amplifier is comprised of a MOS transistor M1 (in this example, a P-channel transistor) receiving a control current Ic and mounted in a current mirror with a MOS transistor M2 of the same type. The sources of transistors M1 and M2 are connected to a positive supply line V+. The drain of transistor M2 constitutes an output terminal S of the amplifier. Terminal S is meant to receive a first terminal of a load Z, for example having an inductive component, a second terminal of which is connected to a negative supply line V− (for example, the ground). The gate of transistor M1 is connected to its own drain and to the gate of transistor M2. The drain of transistor M1 constitutes a terminal E for controlling the amplifier with a current. The surface area ratio of transistors M1 and M2 determines the amplification ratio between the current Ic imposed in the drain of transistor M1 and the output current Is supplied to load Z. The current control has been symbolized by a variable current source 1 between terminal E and line V−. The amplifier assembly shown in FIG. 1 constitutes a generator of variable current Is.

A disadvantage of such an assembly is that it does not operate satisfactorily in the high frequency range (current Is higher than 500 mA) when output current Is is desired to rapidly follow a variation of control current Ic for a high amplification ratio.

For the transistor response to be fast, its equivalent parasitic capacitance brought back on the gate has to be low. This so-called gate capacitance corresponds to the parallel gate-drain and gate-source capacitances. Although the gate-source capacitance generally is higher than the gate-drain capacitance, the latter is inversely proportional to the drain-source voltage. In the high frequency range, it thus has a much higher potential excursion than the gate-source capacitance and its influence over the frequency response of the amplifier thus cannot be neglected. When current Is in load Z increases, the drain-source voltage decreases and the gate capacitance increases with the increase of the gate-drain capacitance. The gate capacitance can reach values of approximately 10 to 20 nanofarads for a current Is of approximately 1.5 amperes.

Such a parasitic capacitance strongly alters the frequency response of the amplifier. Indeed, the output stage introduces a cut-off frequency which is, as a first approximation, proportional to the ratio of the gain transconductance (ratio of the drain current over the gate-source voltage) of transistor M1 over the gate capacitance of transistor M2. The cut-off frequency which varies according to the output current is low for significant currents (approximately one kHz for a current of approximately 1.5 amperes). As a result, the amplifier so constituted has a very low gain for frequencies exceeding approximately 1 kHz.

SUMMARY OF THE INVENTION

The present invention aims at providing a new current amplifier having an output transistor in MOS technology which overcomes the above-mentioned disadvantages.

To achieve this object, the present invention provides a current amplifier including a first MOS transistor, a drain of which defines a first terminal for controlling the amplifier with a current and a source of which is connected to a first supply line; a second MOS transistor, a drain of which constitutes a terminal of current output of the amplifier and a source of which is connected to the first supply line; and at least one first bipolar transistor, a base of which is connected to the first control terminal, an emitter of which is connected to a gate of the first and second MOS transistors and, via a first biasing resistor, to the first supply line, a collector of the first bipolar transistor being connected to a second supply line.

According to an embodiment of the present invention, the amplifier includes a second bipolar transistor, a base of which is connected to the first control terminal, an emitter of which is connected to a gate of the second MOS transistor and, via a second biasing resistor, to the first supply line, a collector of the second bipolar transistor being connected to the second supply line.

According to an embodiment of the present invention, the first and second resistances have the same value.

According to an embodiment of the present invention, the MOS transistors are P-channel transistors, the bipolar transistor(s) being of PNP type and the first supply line constituting a more positive line than the second line.

According to an embodiment of the present invention, the MOS transistors are N-channel transistors, the bipolar transistor(s) being of NPN type and the first supply line constituting a more negative line than the second line.

According to an embodiment of the present invention, the amplifier includes a third N-channel MOS transistor, a drain of which is connected to a second current control terminal and a source of which is connected to the second supply line; a fourth N-channel MOS transistor, a drain of which is connected to the output terminal and a source of which is connected to the second supply line; and at least one third NPN-type bipolar transistor, a base of which is connected to the second control terminal, an emitter of which is connected to a gate of the third MOS transistor and, via a third biasing resistor, to the second supply line, a collector of the third bipolar transistor being connected to the first supply line.

According to an embodiment of the present invention, the amplifier includes a fourth bipolar transistor, a base of which is connected to the second control terminal, an emitter of which is connected to a gate of the fourth MOS transistor and, via a fourth biasing resistor, to the second supply line, a collector of the fourth bipolar transistor being connected to the first supply line.

According to an embodiment of the present invention, all biasing resistances have the same value.

These objects, characteristics and advantages as well as others, of the present invention, will be discussed in detail in the following non-limiting description of specific embodiments of the present invention, in relation with the accompanying drawings.

DETAILED DESCRIPTION

For clarity, the same components have been referred to by the same reference numbers in the different drawings.

A characteristic of the present invention is to implement the output stage of a power amplifier by associating bipolar transistors and MOS transistors.

Figure 2:
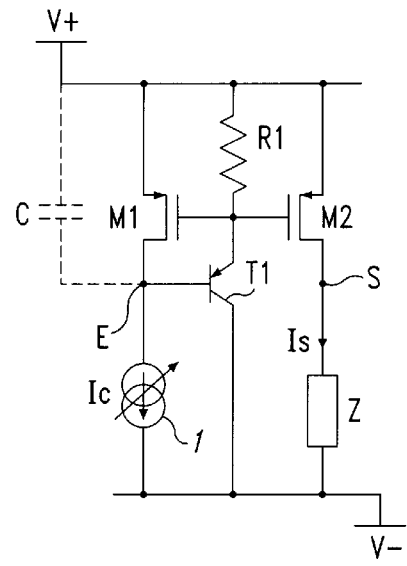
FIG. 2 shows a first embodiment of an output stage of a current amplifier according to the present invention.

FIG. 2 shows a first embodiment of an output stage of a current amplifier according to the present invention.

The amplifier always includes two MOS transistors, respectively M1 and M2 (here, P-channel transistors), between a positive supply line V+ and, respectively, a terminal E for control with a current Ic and an output terminal S of current Is.

The base of a PNP-type bipolar transistor TI is connected to terminal E. Its collector is connected to line V−. Its emitter is connected to the gates of transistors M1 and M2 and, via a resistor R1, to line V+. Resistor R1 is used to bias transistor T1.

A first cut-off frequency of the output stage always is linked with the gate capacitance of transistor M2. However, this first cut-off frequency here is, as a first approximation, proportional to the ratio of the transconductance gain of transistor T1 over the gate capacitance of transistor M2.

Figure 1:
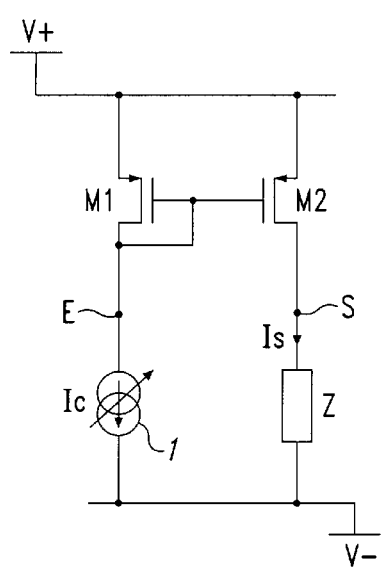
FIG. 1, previously described, is meant to show the state of the art and the problem to solve.

Advantage is taken from the fact that bipolar transistors have a transconductance gain which is clearly higher than that of MOS transistors. Thus, the first cut-off frequency linked with the gate capacitance of transistor M2 always is clearly higher than in a conventional assembly such as shown in FIG. 1 and this despite the fact that the gate capacitance of transistor M2 varies as previously with the output current.

However, the insertion of bipolar transistor T1 introduces a loop (transistors M1 and T1) in the output stage which tends to oscillate from a second cut-off frequency when output current Is becomes significant. This loop thus has to be stabilized in the frequency range desired for the amplifier.

The second cut-off frequency introduced by the loop defined by transistors M1 and T1 is proportional to the ratio of the transconductance gain of transistor M1 over the capacitances present on its drain. Similarly as for transistor M2, the drain-gate capacitance of transistor M1 increases with the current of its drain (here, control current Ic), whereby the frequency from which the loop starts to oscillate lowers as the output current raises.

There can be no action upon the transconductance gain of transistor M1 without modifying the desired current amplification ratio.

To stabilize loop M1/T1, a conventional solution consists of placing a capacitor C (shown in dotted lines) of high value on the drain of transistor M1. However, such a capacitor risks to decrease the cut-off frequency of the general amplifier which depends, among others, on the source I of control current Ic. This solution thus requires that the dynamic operating frequency range desired for the amplifier be compatible with a compromise performed between the value of the capacitance brought on the drain of transistor M1 and the cut-off frequency of the general amplifier.

Figure 3:
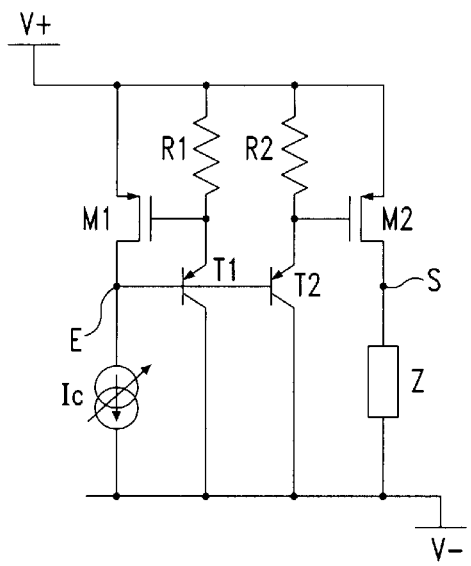
FIG. 3 shows a second embodiment of an output stage of a current amplifier according to the present invention.

FIG. 3 shows a second embodiment of the present invention.

According to this embodiment, each transistor M1 or M2 is associated with a bipolar transistor, respectively T1 or T2, of PNP type. Transistor T1 is connected as in the first embodiment to decrease the input impedance of the assembly.

The base of transistor T2 is, like the base of transistor T1, connected to terminal E. The emitter of transistor T2 is connected to the gate of transistor M2 and, via a biasing resistor R2, to line V+. Resistances R1 and R2 have the same value. The collector of transistor T2 is, like the collector of transistor T1, connected to line V−.

A characteristic of this embodiment is that the gates of transistors M1 and M2 now no longer are interconnected.

In an integrated circuit implementation, the difference between the base-emitter voltages of transistors T1 and T2 due to technological dispersions and to their respective operating temperatures is negligible with respect to the gate-source voltage of the MOS transistors. Thus, it can be assumed that the respective gates of transistors M1 and M2 always are at substantially the same potential. The static operation of the output stage thus is not substantially altered by the addition of bipolar transistors T1 and T2.

The cut-off frequency linked with the loop comprised of transistors T1 and M1 now corresponds to the ratio of the transconductance gain of transistor T1 over the gate capacitance of transistor M1. Since transistors M1 and M2 are sized for current Is to be clearly higher than current Ic, the gate capacitance of transistor M1 is clearly lower than that of transistor M2. Yet, the transconductance gain of transistor T1 is, like that of transistor T2, very high (bipolar transistors). The cut-off frequency introduced by the loop thus is clearly higher than the cut-off frequency which depends on the ratio of the transconductance gain of transistor T2 over the gate capacitance of transistor M2. Thus, the loop constituted by transistors M1 and T1 is stable for frequencies lower than the cut-off frequency linked with the gate capacitance of transistor M2.

Since this cut-off frequency has been considerably increased by being made proportional to the transconductance gain of a bipolar transistor (transistor T2 in the second embodiment) and no longer to the transconductance gain of transistor M1, the lowest cut-off frequency of the output stage is clearly much higher than that of a conventional assembly such as shown in FIG. 1.

Figure 4:
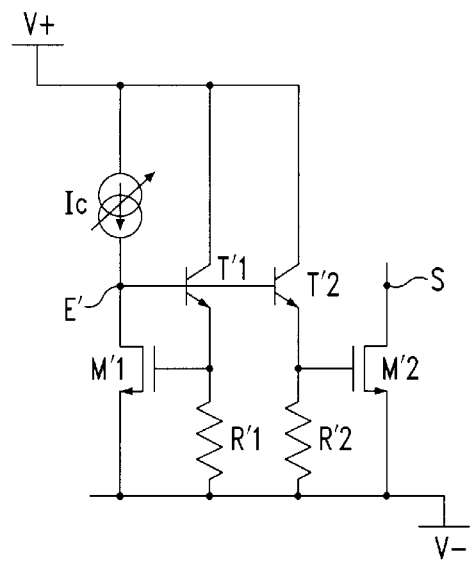
FIG. 4 shows a variant of the second embodiment shown in FIG. 3.

FIG. 4 shows a variant of the assembly of FIG. 3 for an output stage comprised of N-channel MOS transistors. The structure of the assembly is similar to that previously described. Two MOS transistors M'1 and M'2 are connected by their respective sources to line V−. The drain of transistor M'2 defines output terminal S. The drain of transistor M'1 constitutes an input terminal E' receiving a control current I'c determined by a current source. Two NPN-type bipolar transistors T'1 and T'2 have their respective bases connected to terminal E' and their respective collectors connected to line V+. The emitter of transistor T'1 is connected to the gate of transistor M'1 and, via a resistor R'1, to line V−. The emitter of transistor T'2 is connected to the gate of transistor M'2 and, via a resistor R'2, to line V−.

The operation of the assembly shown in FIG. 4 is similar to the operation described in relation with FIG. 3.

Figure 5:
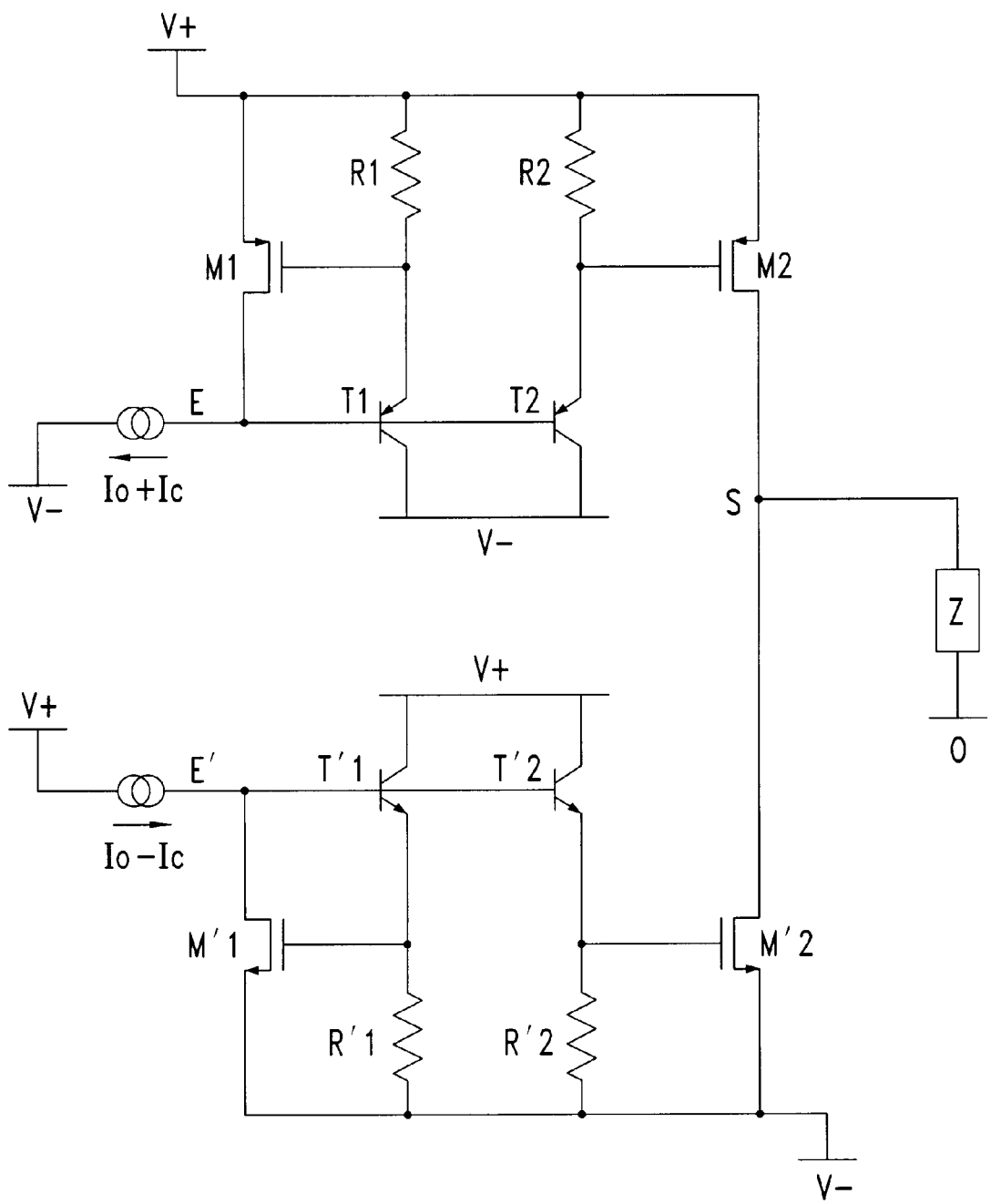
FIG. 5 shows a third embodiment of an output stage of a current amplifier according to the present invention.

The two assemblies of FIGS. 3 and 4 can be associated to constitute a symmetrical power amplifier in BICMOS technology, as shown in FIG. 5. In FIG. 5, the respective drains of transistors M2 and M'2 then are connected to constitute a single output terminal S. Each input terminal E and E' is used to set the current in the transistors, respectively the higher transistors M1 and M2 and the lower transistors M'1 and M'2.

Of course, the present invention is likely to have various alterations, modifications, and improvements which will readily occur to those skilled in the art. In particular, the respective sizings of the power MOS and bipolar transistors and of the biasing resistors are within the abilities of those skilled in the art according to the desired characteristics of the amplifier.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A current amplifier including:
    a first MOS transistor, a drain of which defines a first terminal for controlling the amplifier with a current and a source of which is connected to a first supply line;
    a second MOS transistor, a drain of which constitutes a terminal for current output of the amplifier and a source of which is connected to the first supply line;
    a first bipolar transistor, a base of which is connected to the first control terminal, an emitter of which is connected to a gate of the first MOS transistor and, via a first biasing resistor, to the first supply line, a collector of the first bipolar transistor being connected to a second supply line; and
    a second bipolar transistor, a base of which is connected to the first control terminal, an emitter of which is connected to a gate of the second MOS transistor and, via a second biasing resistor, is connected to the first supply line, a collector of the second bipolar transistor being connected to the second supply line.

2. The amplifier according to claim 1, wherein the first and second resistances have the same value.

3. The amplifier according to claim 1, wherein the MOS transistors are P-channel transistors, the bipolar transistor has a PNP type and the first supply line has a more positive voltage than the second line.

4. The amplifier according to claim 1, wherein the MOS transistors are N-channel transistors, the bipolar transistor has a NPN type and the first supply line has a more negative voltage than the second line.

5. The amplifier according to claim 3, including:
    a third N-channel MOS transistor, a drain of which is connected to a second current control terminal and a source of which is connected to the second supply line;
    a fourth N-channel MOS transistor, a drain of which is connected to the output terminal and a source of which is connected to the second supply line; and
    at least one third NPN-type bipolar transistor, a base of which is connected to the second control terminal, an emitter of which is connected to a gate of the third MOS transistor and, via a third biasing resistor, is connected to the second supply line, a collector of the third bipolar transistor being connected to the first supply line.

6. The amplifier according to claim 5, including a fourth bipolar transistor, a base of which is connected to the second control terminal, an emitter of which is connected to a gate of the fourth MOS transistor and, via a fourth biasing resistor, is connected to the second supply line, a collector of the fourth bipolar transistor being connected to the first supply line.

7. The amplifier according to claim 5, wherein all biasing resistances have the same value.

8. A current amplifying circuit comprising:
    a first MOS transistor coupled between a voltage supply and an input terminal;
    an adjustable current source coupled between the input terminal and a reference voltage, the adjustable current source varying based on a signal received at the input terminal;
    a second MOS transistor coupled between the voltage supply and an output terminal; and
    a bipolar transistor coupled to the gates of both MOS transistors and coupled through a resistor to the voltage supply, the bipolar transistor also coupled to the input terminal and the reference voltage.

9. The current amplifying circuit of claim 8 further comprising:
    a capacitor coupled between the voltage supply and the input terminal.

10. A current amplifying circuit comprising:
    a first MOS transistor coupled between a voltage supply and an input terminal;
    an adjustable current source coupled between the input terminal and a reference voltage, the adjustable current source varying based on a signal received at the input terminal;
    a second MOS transistor coupled between the voltage supply and an output terminal;
    a bipolar transistor coupled to the gate of the first MOS transistor and coupled through a resistor to the voltage supply, the bipolar transistor also coupled to the input terminal and a reference voltage; and
    a second bipolar transistor coupled to the gate of the second MOS transistor and coupled through a second resistor to the voltage supply, the second bipolar transistor also coupled to the input terminal and the reference voltage.

11. The current amplifying circuit of claim 10 wherein the MOS transistors are P-channel transistors.

12. The current amplifying circuit of claim 10 wherein the bipolar transistors are PNP-type transistors.

13. The current amplifying circuit of claim 10 wherein the first and second resistances have the same value.

14. The current amplifying circuit of claim 10, further comprising:
    a third MOS transistor connected between a second input terminal and the reference voltage;
    a fourth MOS transistor connected between the output terminal and the reference voltage;
    a third bipolar transistor, coupled to the supply voltage, the second input terminal, and to the gate of the third MOS transistor; and
    a third resistance coupled between the third bipolar transistor and the reference voltage.

15. The current amplifying circuit of claim 14, further comprising:
    a fourth bipolar transistor, coupled to the supply voltage, the second input terminal, and to the gate of the fourth MOS transistor; and
    a fourth resistance coupled between the fourth bipolar transistor and the reference voltage.

16. The current amplifying circuit of claim 15 wherein all of the resistances have the same value.

* * * * *

UNITED STATES PATENT AND TRADEMARK OFFICE
CERTIFICATE OF CORRECTION

PATENT NO. : 5,936,471
DATED : August 10, 1999
INVENTOR(S) : Marius Reffay and Michel Barou It is certified that error appears in the above-indentified patent and that said Letters Patent is hereby corrected as shown below:

On the title page: Item [73] Assignee: -- SGS THOMSON MICROELECTONICS S.A., Gentilly, France--.

Signed and Sealed this

Thirteenth Day of March, 2001

Attest:

NICHOLAS P. GODICI

Attesting Officer  Acting Director of the United States Patent and Trademark Office